United States Patent [19]

Urushima

[11] Patent Number: 5,474,957
[45] Date of Patent: Dec. 12, 1995

[54] PROCESS OF MOUNTING TAPE AUTOMATED BONDED SEMICONDUCTOR CHIP ON PRINTED CIRCUIT BOARD THROUGH BUMPS

[75] Inventor: Michitaka Urushima, Tokyo, Japan

[73] Assignee: NEC Corporation, Japan

[21] Appl. No.: 430,590

[22] Filed: Apr. 28, 1995

[30] Foreign Application Priority Data

May 9, 1994 [JP] Japan .................................. 6-094881

[51] Int. Cl.$^6$ .................................................. H01L 21/60
[52] U.S. Cl. ..................... 437/209; 437/211; 437/215; 437/217; 437/219
[58] Field of Search ...................... 437/209, 210, 437/211, 212, 213, 214, 215, 216, 217, 218, 219, 220

[56] References Cited

U.S. PATENT DOCUMENTS

| | | | |
|---|---|---|---|
| 5,064,706 | 11/1991 | Ueda et al. | 437/217 |
| 5,240,588 | 8/1993 | Ucaida | 437/218 |
| 5,258,330 | 11/1993 | Khandros et al. | 437/215 |
| 5,262,351 | 11/1993 | Bureau et al. | 437/215 |
| 5,346,861 | 9/1994 | Khandros et al. | 437/217 |
| 5,362,656 | 11/1994 | McMahon | 437/211 |
| 5,376,588 | 12/1994 | Penose | 437/211 |
| 5,409,865 | 4/1995 | Karnezos | 437/214 |

Primary Examiner—Kevin M. Picardat

[57] ABSTRACT

Conductive leads are connected at inner ends thereof to electrodes of a semiconductor chip through a tape automated bonding process, and bumps are formed on the other ends of the conductive leads so as to economically and reliably mount the semiconductor chip on a circuit board through a concurrent reflow.

14 Claims, 8 Drawing Sheets

PROCESS OF MOUNTING TAPE AUTOMATED BONDED SEMICONDUCTOR CHIP ON PRINTED CIRCUIT BOARD THROUGH BUMPS

FIELD OF THE INVENTION

This invention relates to a mounting technology for a semiconductor chip and, more particularly, to a mounting technology for a semiconductor chip through a tape automated bonding on a printed circuit board.

DESCRIPTION OF THE RELATED ART

A typical example of a process of mounting a semiconductor chip on a film carrier tape available for the TAB (Tape Automated Bonding) technology is illustrated in FIGS. 1A to 1C and 2, and FIG. 2 shows a layout of the film carrier tape at the stage shown in FIG. 1A.

The prior art mounting process starts with preparation of a film carrier tape. Namely, sprocket holes 1, a device hole 2 and separation holes 3 are formed in a base film 4 of insulating material such as, for example, polyimide. The portions between the device hole 2 and the separation holes 3 are called as suspenders 4a, and the portions between the separation holes 3 are referred to as bridges 4b.

The sprocket holes 1 are arranged along side edges of the base film 4, and used for moving and positioning the film carrier tape in a later stage. The device hole 2 is wide enough to accommodate a semiconductor chip 5, and metal bumps 5a are formed on electrodes exposed to the upper surface of the semiconductor chip 5 for an inner lead bonding. The separation holes 3 are abbreviated as "OLB (Outer Lead Bonding)" holes, and are provided around the device hole 2.

Subsequently, a metal foil of, for example, copper is laminated on the upper surface of the base film 4, and adhesive paste 6 bonds the metal foil to the upper surface of the base film 4. The metal foil is patterned into a plurality of conductive leads 7 by using photo-lithographic technologies. Each of the conductive leads 7 is broken down into an inner lead portion, an outer lead portion and a pad portion for electric tests. The inner lead portion 6a partially projects into the device hole 2, and is merged into the outer lead portion in the suspender 4a. The outer lead portion extends across the separation holes 3, and is merged into the pad portion. The conductive leads 7 are covered with gold, tin or solder through galvanization, and the gold film, the tin film or the solder film serves as a protecting film.

Sprocket wheels (not shown) conveys the film carrier tape, and the device hole 2 is aligned with the semiconductor chip 5. Then, a bonding tool (not shown) is pressed against the bumps 5a, and heat is applied from the bonding tool to the inner lead portions of the conductive leads 7. Thus, the conductive leads 7 are bonded to the bumps 5a through the thermo-compression bonding technique. An eutectic process may be used for bonding the conductive leads 7 to the bumps 5a. The resultant structure at this stage is illustrated in FIGS. 1A and 2.

Subsequently, a piece 8 of resin is provided on the upper surface of the semiconductor chip 5 exposed to the device hole 2 as shown in FIG. 1B, and prevents a circuit pattern formed on the upper surface of the semiconductor chip 5 from undesirable contamination.

The bridges 4b of the film carrier tape 4 are broken, and the suspenders 4a are separated from the film carrier tape together with the semiconductor chip 5 and the conductive leads 7.

The manufacturer previously prepares a printed circuit board 9, and a conductive pattern 9a is printed on an insulating rigid board 9b. The semiconductor chip 5 and the outer lead portions of the conductive leads 7 are aligned with the conductive pattern 9a, and the outer lead portions are bonded to the conductive pattern 9a through the thermo-compression bonding technique.

However, a problem is encountered in the prior art mounting technology in the production cost. In detail, the conductive leads 7 are of the order of 35 microns in thickness, and the outer lead portions of the conductive leads 7 are expected to be accurately patterned and highly coplanar so as to prevent the semiconductor device from a bond lift-off. These conditions require a special purpose bonding machine for bonding the outer lead portions of the conductive leads 7 to the conductive pattern 9a of the printed circuit board 9, and the mounting system including such a special purpose machine is hardly available for other semiconductor devices of a different type such as QFP (QUAD FLAT PACK) mounted through a concurrent reflow step. This results in a large amount of the plant and equipment investment which in turn increases the production cost of the semiconductor device.

As described above, QFP is desirable for the productivity because of the concurrent reflow. However, the pitch of the outer lead portions is minimized at 0.4 millimeter, and sets a limit on the interface of an integrated circuit. An attractive break-through technology is introduced in NIKKEI MICRODEVICES, 1994, May, pages 58 to 64, and is called as the ball grid array. A large number of solder-bumps are arrayed on a back surface of a GBA-type package, and are rather dense than the QFP. For example, QFP requires the minimum pitch of 0.4 millimeter for 220 signal pins on a square area of 23 to 24 millimeters. However, the GBA realizes the 220 signal pins on the same area at 1.5 millimeter pitch. This means that the GBA technology can decrease the occupation area of the signal pins and, accordingly, the lengths of the signal paths. The decreased signal paths improve device characteristics.

Thus, the GBA technology is very attractive to manufacturers, and a multi-level printed circuit board is used for the GBA package. The multi-level printed circuit board is formed from ceramics plates or films such as the tape automated bonding tapes. Japanese Patent Publication of Unexamined Application No. 63-34936 discloses the multi-level printed circuit board formed from the tape automated bonding tapes . According to the Japanese Patent Publication of Unexamined Application, a conductive pattern is formed on a major surface of a base film, and is electrically connected through through-holes formed in the base film to terminals on the back surface. The terminals are connected to a printed circuit board. Moreover, it is necessary to fabricate a multi-level wiring structure on the film. This results i an highly expensive package.

Another problem inherent in the prior art mounting technology is a low yield. As described hereinbefore, the conductive leads 7 are bonded to the conductive pattern 9a through the thermo-compression bonding technique, and are hardly repaired even if the bond lift-off takes place.

SUMMARY OF THE INVENTION

It is therefore an important object of the present invention to provide a mounting technology which is economical and reliable.

To accomplish the object, the present invention proposes to connect conductive leads through bumps to a conductive pattern.

In accordance with one aspect of the present invention, there is provided a process of mounting a semiconductor chip on a conductive circuit pattern, comprising the steps of: a) preparing a tape automated bonding tape having a film carrier tape formed with sprocket holes, a device hole and separation holes around the device hole and a pattern formed from a metal film on one surface of the film carrier tape and containing inner leads and pads coplanar with the inner leads; b) connecting the inner leads to electrodes of a semiconductor chip; d) covering connections between the inner leads and the electrodes with a piece of resin for protecting the semiconductor chip and making the connection secure; e) forming bumps on the pads; f) cutting along the separation holes for a separation; g) aligning the bumps with pads formed on a mounting board; and h) connecting the bumps to the pads on the mounting board.

In accordance with another aspect of the present invention, there is provided a process of mounting a semiconductor chip on a mounting board means, comprising the steps of: a) preparing a semiconductor chip, a mounting board means and a tape automated bonding tape including a film carrier tape having a first area and a second area separable from the first area and a conductive pattern having inner leads and pads electrically connected to the inner leads formed in the second area; b) bonding the inner leads to electrodes of the semiconductor chip; c) forming conductive bumps on the pads; d) separating the second area having the conductive pattern electrically connected to the electrodes of the semiconductor chip from the first area; and e) bonding the bumps to a conductive pattern on the mounting board means.

BRIEF DESCRIPTION OF THE DRAWINGS

The features and advantages of the mounting technology according to the present invention will be more clearly understood from the following description taken in conjunction with the accompanying drawings in which.

DESCRIPTION OF THE PREFERRED EMBODIMENTS

First Embodiment

Figure 1A:
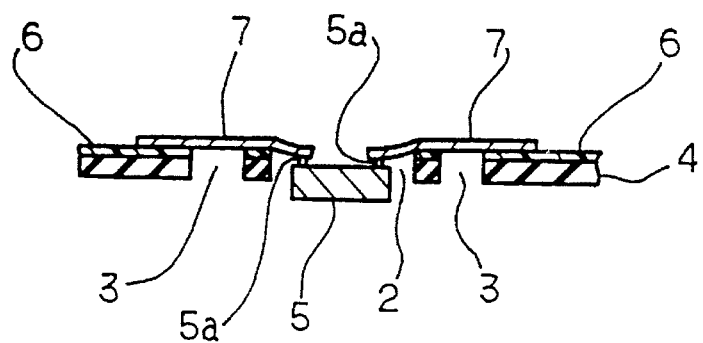
FIGS. 1A to 1C are cross sectional views showing the prior art mounting process for the semiconductor device.
Figure 1B:
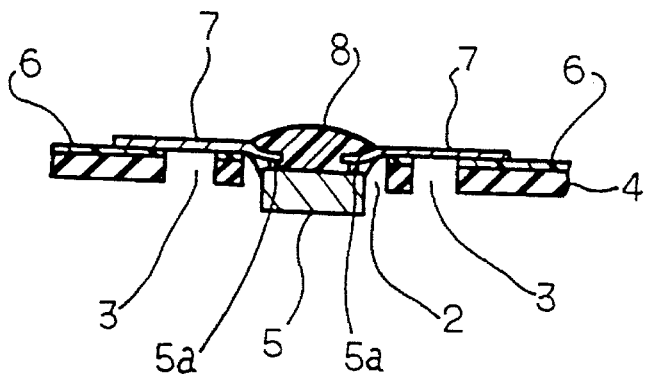
Figure 1C:
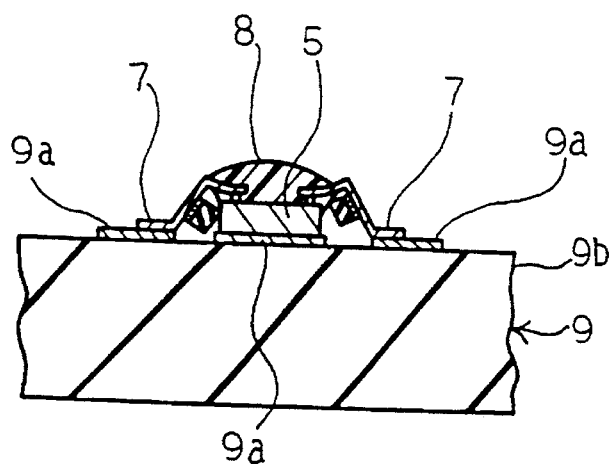
Figure 2:
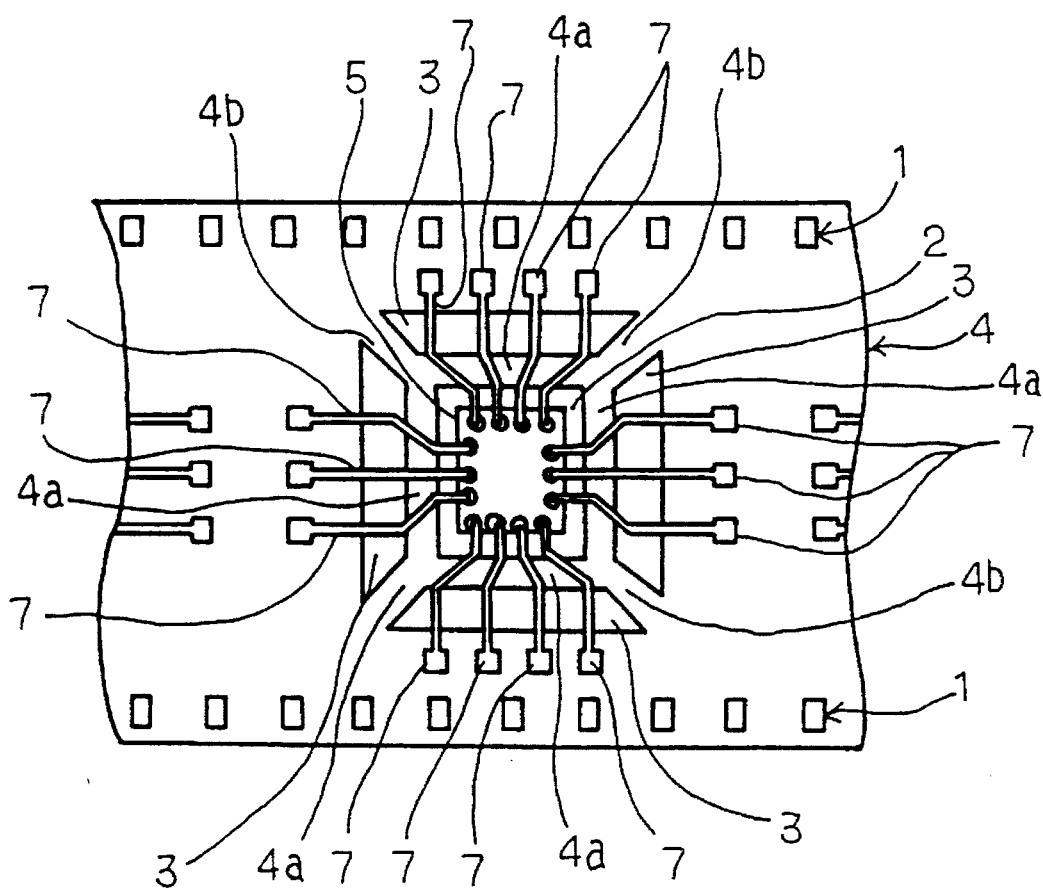
FIG. 2 is a plan view showing the layout on the carrier film shown in FIG. 1A.
Figure 3A:
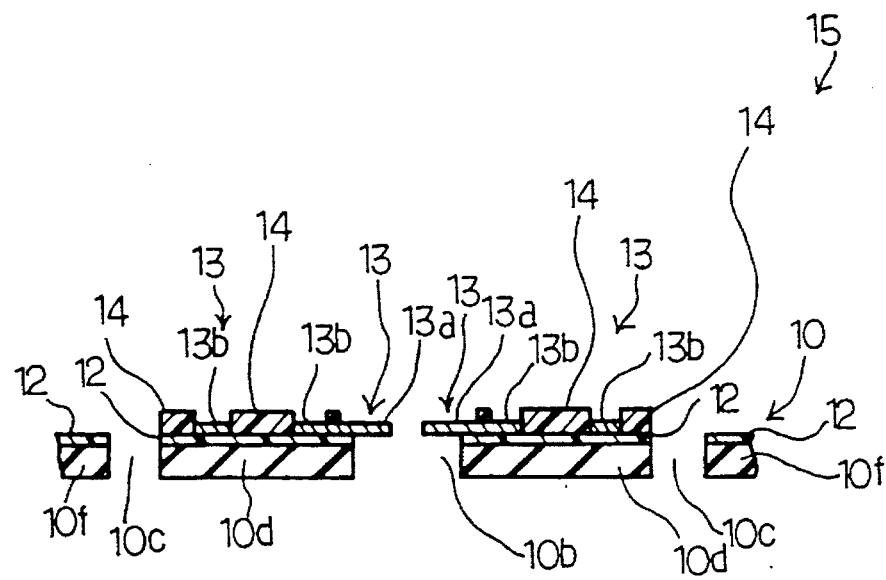
FIGS. 3A to 3E are cross sectional views showing a mounting process for a semiconductor device according to the present invention.
Figure 3B:
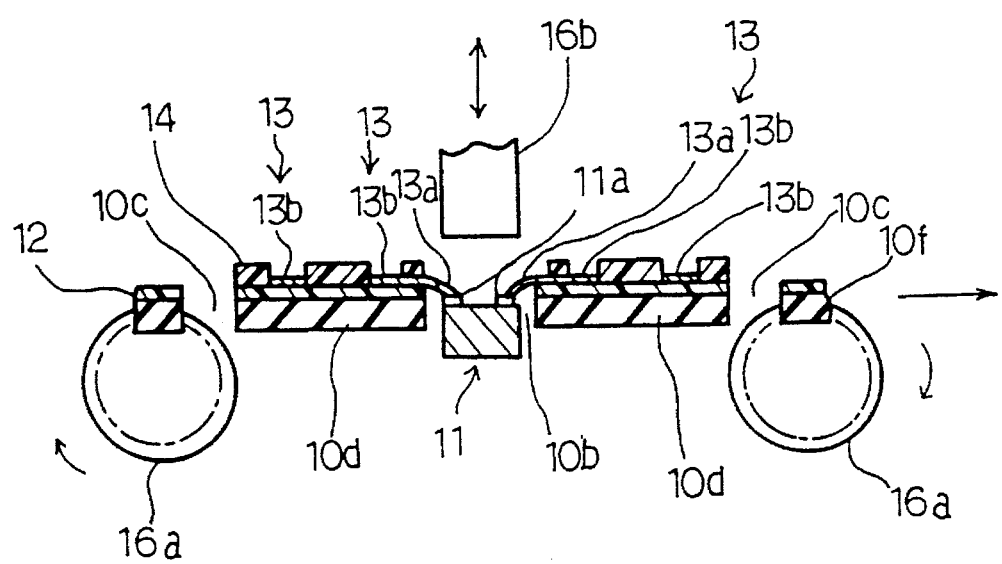
Figure 3C:
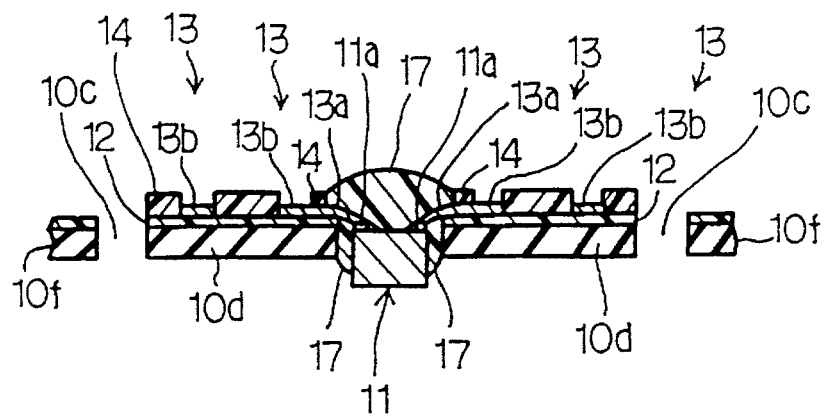
Figure 3D:
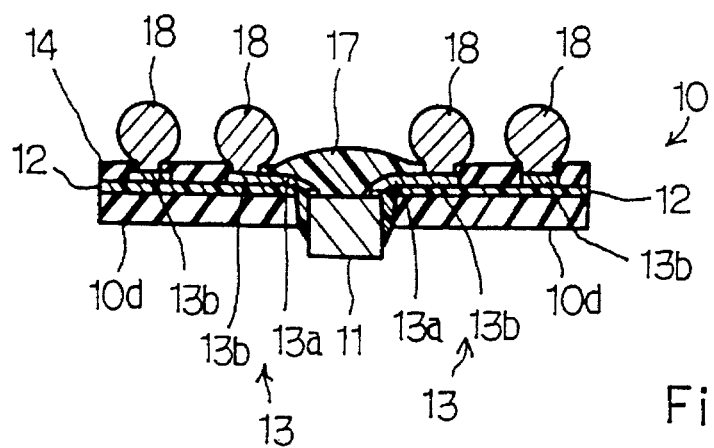
Figure 3E:
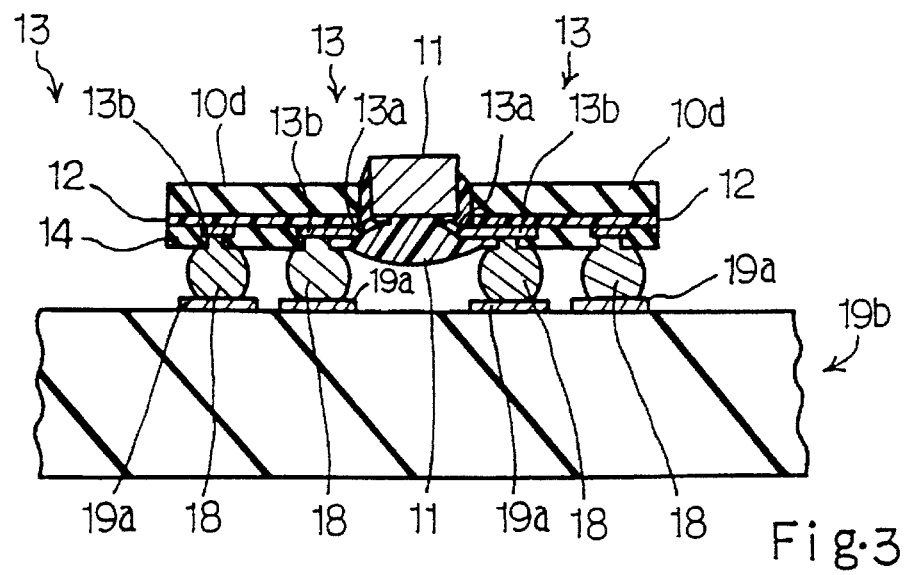
Figure 4:
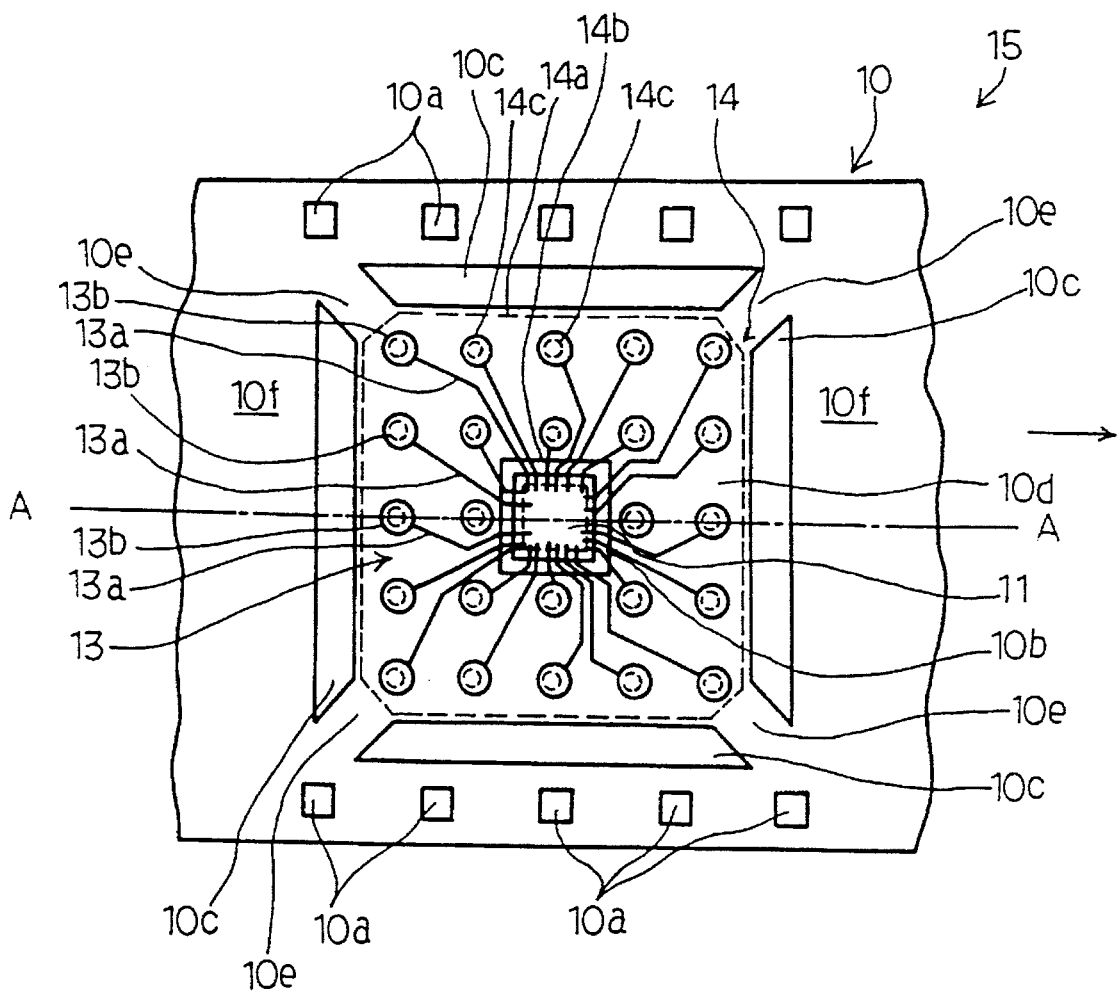
FIG. 4 is a plan view showing a semiconductor chip connected to a carrier tape.

FIGS. 3A to 3E and 4 illustrate a mounting process embodying the present invention, and FIGS. 3A to 3E show cross sections taken along line A—A of FIG. 4. However, a resin coating is omitted from the structure shown in FIG. 4 for the sake of simplicity.

The mounting process starts with preparation of a flexible film carrier tape 10, and two lines of sprocket holes 10a are formed along the two side edges of the flexible film carrier 10. Device holes 10b are further formed at intervals, and are slightly wider than a semiconductor chip 11. Four elongated separation holes 10c are provided around each of the device holes 10b, and a suspender area 10d are connected through bridging areas 10e to a frame area 10f. The frame area 10f serves as a first area, and the suspender area 10e serves as a second area in this instance.

Adhesive compound 12 bonds a conductive metal foil of, for example, copper to a surface of the flexible film carrier 10, and the conductive metal foil is patterned into a plurality of conductive leads 13 by using photo-lithographic techniques.

Each of the conductive leads 13 is broken down into an inner lead portion 13a projecting into the device hole 10b and a pad portion 13b merged with the inner lead portion 13a, and the pad portions 13b are arranged in an array as will be better seen in FIG. 4. In this instance, the pad portions 13b are arrayed at intervals of 1.0 millimeter.

At least the conductive leads 13 and the exposed suspender area 10d are coated with cover-resist, and the cover-resist film is patterned so as to expose center areas of the pad portions 13b and the inner peripheral sub-area of the suspender area 10d. Broken lines 14a, 14b and 14c respectively indicate an outer periphery and an inner periphery of the cover-resist layer 14 and small holes exposing parts of the pad portions 13b in FIG. 4.

An initial elastic modulus of the cover-resist 14 is less than a tenth of that of the base film 10, and the flatness of the base film 10 is acceptable for later stages. It is recommendable to use a cover-resist 14 having the initial elastic modulus about 1 twentieth so as to make the warp of the base film 10 negligible. On the other hand, if an epoxy resin is used as the cover-resist 14, the initial elastic modulus is of the order of 200 kg/mm$^2$, and the warp of the base film 10 is serious in the later stages.

The openings of the cover-resist 14 are slightly smaller in area than the pad portions 13b. If the pad portions 13b are 0.6 millimeter in diameter, the openings in the cover-resist 14 are about 0.5 millimeter in diameter. It is not necessary to plate the conductive leads 13 on the suspender area 10d, and the omission of the plating stage decreases the production cost of the semiconductor device.

In a modification, the pad portions 13b are arranged closer to the separation holes 10c, and test pads and plated wirings are formed. However, the pad portions 13b are available as check pads for a short-circuit of the wiring pattern, and this is conducive to scaling down of the semiconductor device.

Thus, a tape-automated bonding tape 15 is completed, and the resultant structure of this stage is illustrated in FIG. 3A.

The tape-automated bonding tape 15 is set into an inner bonding machine, and rotating sprockets 16a are sequentially brought into meshing engagement with the sprocket holes 10a so as to convey the tape-automated bonding tape 15 in synchronism with a carrier tape (not shown) carrying the semiconductor chips 11. The semiconductor chip 11 has a plurality of electrodes 11a connected to an electric circuit fabricated in the semiconductor chip 11, and the inner bonding machine aligns the inner lead portions 13a with the electrodes 11a under a thermo-compressing tool 16b. The thermo-compressing tool 16b presses the inner lead portions 13a against the electrodes 11a, and the inner lead portions 13a are bonded to the electrodes 11a through the thermocompression. The resultant structure of this stage is illustrated in FIG. 3B.

Subsequently, a piece of resin 17 covers the connections between the electrodes 11a and the inner lead portions 13a, and fills a space left between the semiconductor chip 11 and the base film 10 as shown in FIG. 3C.

The piece of resin 17 further covers the inner peripheral sub-area of the suspender area 10d, and is merged with the cover-resist 14. For this reason, the piece of resin 17 is wider than the device hole 10b by at least one millimeter. It is recommendable to regulate the height of the piece of resin 17 equal to be not greater than 250 microns with respect to the upper surface of the semiconductor chip 11.

The piece of resin 17 prevents the connection between the electrodes 11a and the inner lead portions 13a from oxidation and contamination, and securely fixes the semiconductor chip 11 to the inner lead portions 13a and the suspender area 10d of the tape-automated bonding tape.

Subsequently, solder balls are provided on the pad portions 13b, and are melted in nitrogen atmosphere. Then, the solder balls are bonded to the pad portions 13b, and bumps 18 are provided on the pad portions 13b, respectively. The bumps 18 are larger in diameter than the openings in the cover-resist 14. In this instance, the bumps are 0.8 millimeter in diameter.

Another formation technique for the bumps 18 is print. If the pad portions 13b are covered with thick oxide films, a flux is necessary. However, if the flux is not used, it is not necessary to make the openings in the cover-resist 14 smaller than the pad portions 13b.

The bridging areas 10e are cut, and the suspender area 10d and the semiconductor chip 11 are separated from the frame area 10f as shown in FIG. 3D.

The conductive leads 13 connected to the semiconductor chip 11 are subjected to an electric selection. With a positive diagnosis, the bumps 18 are aligned with a conductive pattern 19a of a printed circuit board 19b. The bumps 18 are bonded to the conductive pattern 19a through a concurrent reflow stage. The reflow machine is commonly available for other types of semiconductor chips, and a special purpose outer bonding machine is not required. For this reason, the semiconductor device according to the present invention is economically mounted on the printed circuit board 19b.

Moreover, the bumps 18 are securely bonded to the conductive pattern 19a, and improves the yield of the semiconductor device.

A modification of the first embodiment has a heat radiating plate attached to the semiconductor chip 11 by means of adhesive compound having a large coefficient of heat transfer. Another modification may further has a heat sink attached to the heat radiating plate by means of the adhesive compound. The heat radiating plate and the heat sink are successively attached to the semiconductor chip 11 after the mount on the printed circuit board 19b.

As will be appreciated from the foregoing description, the bumps 18 securely fix the pad portions 13b to the conductive pattern 19a of the printed circuit board 19b without a special purpose machine, and the production cost, the yield and the reliability of the semiconductor device is surely improved.

Second Embodiment

Figure 5A:
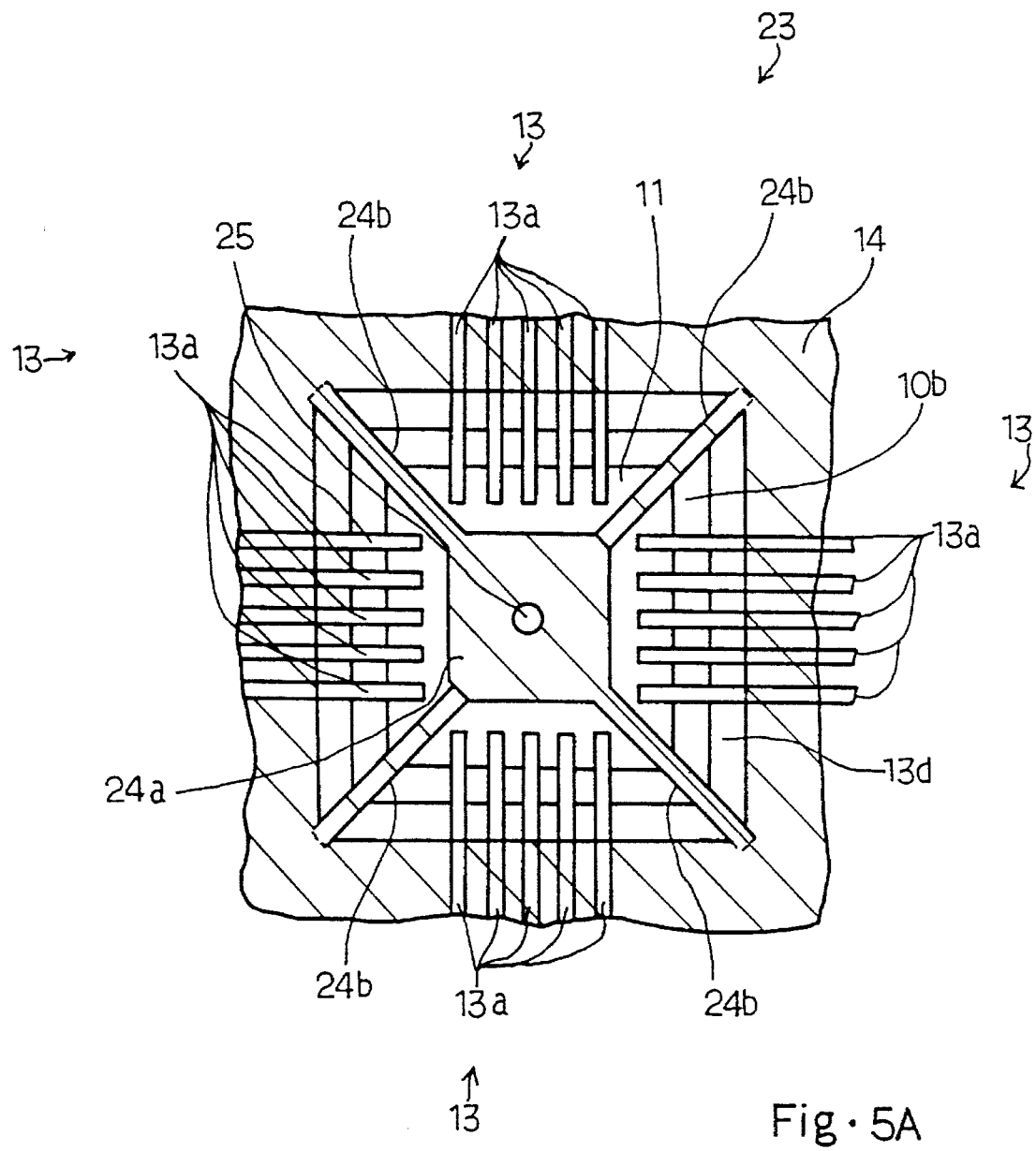
FIG. 5A is a plan view showing an essential step of another mounting process sequence according to the present invention.
Figure 5B:
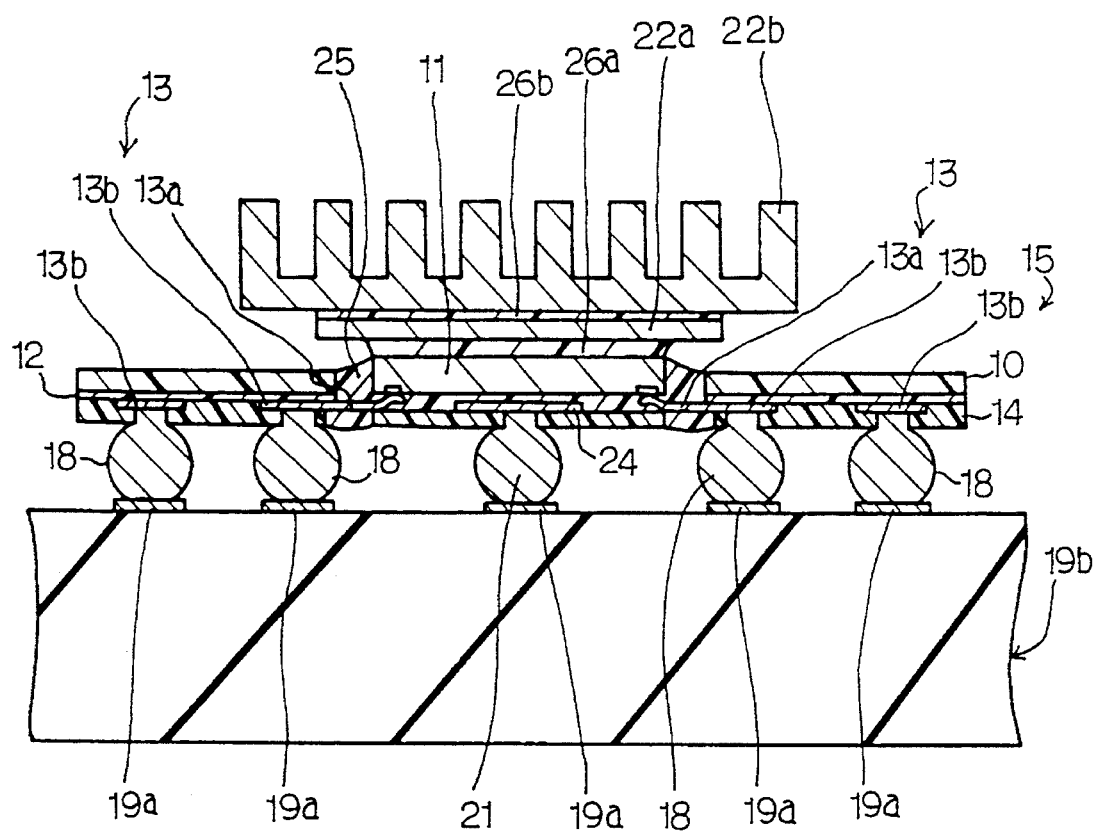
FIG. 5B is a cross sectional view showing another essential step of the process sequence.

FIGS. 5A and 5B shows essential stages of another mounting process embodying the present invention. A heat radiating bump 21, a heat radiating plate 22a and a heat sink 22b are provided for the semiconductor device, and other components are similar to those of the first embodiment. For this reason, the other components are labeled with the same references as the corresponding parts of the semiconductor device implementing the first embodiment without detailed description.

The process sequence implementing the second embodiment also starts with preparation of a tape-automated bonding tape 23, the semiconductor device 11, the printed circuit board 19b, the heat radiating plate 22a and the heat sink 22b, and are similar to the mounting process except for the followings.

The tape-automated bonding tape 23 is similar to the tape-automated bonding tape 15 except for a suspended lead 24. The suspended lead 24 is concurrently formed from the same metal foil as the conductive leads 13, and has a central portion 24a over the semiconductor chip 11 and bridging portions 24b merged with the central portion 24a.

The cover-resist 14 extends over the suspended lead 24, and further covers it. In order to clearly discriminate the cover-resist 14, the cover-resist 14 is indicated by hatch lines in FIG. 5A.

An opening 25 is formed in the cover-resist 14, and exposes a part of the central portion 24a. It is desirable for the opening 25 to be equal in diameter to the openings on the pad portions 13b, because the opening 25 is concurrently formed in the cover-resist 14 together with the openings over the pad portions 13b. However, if the bumps are formed through a printing process, it is not necessary to regulates the opening 25 to the diameter of the openings on the pad portions 13b.

A kind of resin 25 is supplied from a gap between the suspended lead, and spreads between the suspended lead 24 and the semiconductor chip 11 through the capillary phenomenon. In other words, it is recommendable to select the resin 25 having the viscosity small enough to be spread through the capillary phenomenon.

If the suspended lead 24 is supported by means of, for example, a vacuum nozzle during the supply of the resin 25, the resin 24 sufficiently spreads over the space between the suspended lead 24 and the semiconductor chip 11.

The heat radiating bump 21 keeps the semiconductor chip 11 in parallel to the surface of the printed circuit board 19b.

If a larger heat radiating capability is expected to the semiconductor device, the heat radiating plate 22a of aluminum is bonded to the semiconductor chip 11 by means of an adhesive paste layer 26a with a large coefficient of heat transfer.

If a much larger heat radiating capability is expected to the semiconductor device, the heat sink 22b is further bonded to the heat radiating plate 22a by means of an adhesive paste layer 26b having a large coefficient of heat transfer.

The attachment of the heat radiating plate 22a and the heat sink 22b is carried out after the bonding stage between the bumps 18 and 21 and the conductive pattern 19a.

Although the heat radiating plate 22a and the heat sink 22b are available for the semiconductor device implementing the first embodiment as described hereinbefore, it is recommendable to bond the heat radiating plate 22a to not only the semiconductor chip 11 but also the base film 10, because the weight pushes down the semiconductor chip in the absence of the heat radiating bump 21. Alternately, a solder plate or a resin column may be previously provided on the printed circuit board 19b, and the solder plate or the resin column support the semiconductor chip at the piece of resin 25.

As will be appreciated from the foregoing description, the semiconductor device implementing the second embodiment achieves all the advantages of the first embodiment and large heat radiation. Namely, the semiconductor device according to the present invention does not need a printed circuit board with through-holes, a ceramics plate with through-holes and a TAB tape with through-holes, and a economical standard TAB tape is available. The bumps 18 and 21 are concurrently bonded to the conductive pattern 19a through a reflow, and the semiconductor device according to the present invention can share a reflow system with other types of semiconductor devices.

Although particular embodiments of the present invention have been shown and described, it will be obvious to those skilled in the art that various changes and modifications may be made without departing from the spirit and scope of the present invention. For example, the pad portions 13b may be electrically connected through the bumps 18 to a conductive pattern formed on a flexible film.

Moreover, the inner lead portions are concurrently bonded to the electrodes on the semiconductor chip by using the tool in the above described embodiments. In another process according to the present invention, the electrodes may be sequentially bonded to the electrodes.

Figure 6A:
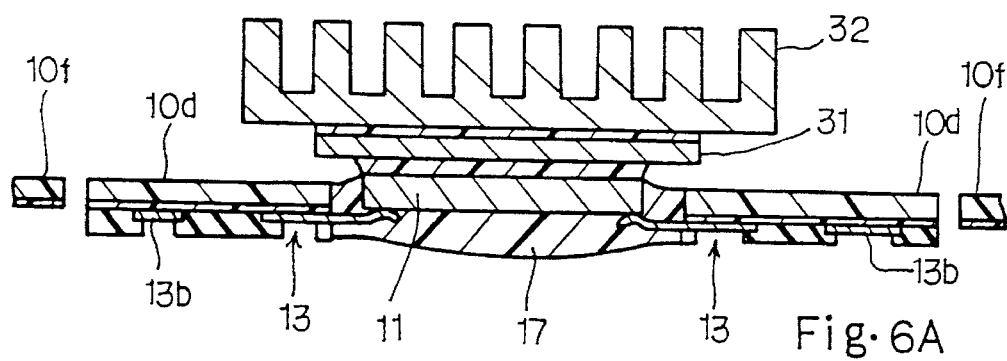
FIG. 6A is a cross sectional view showing an essential step of a modified process according to the present invention.
Figure 6B:
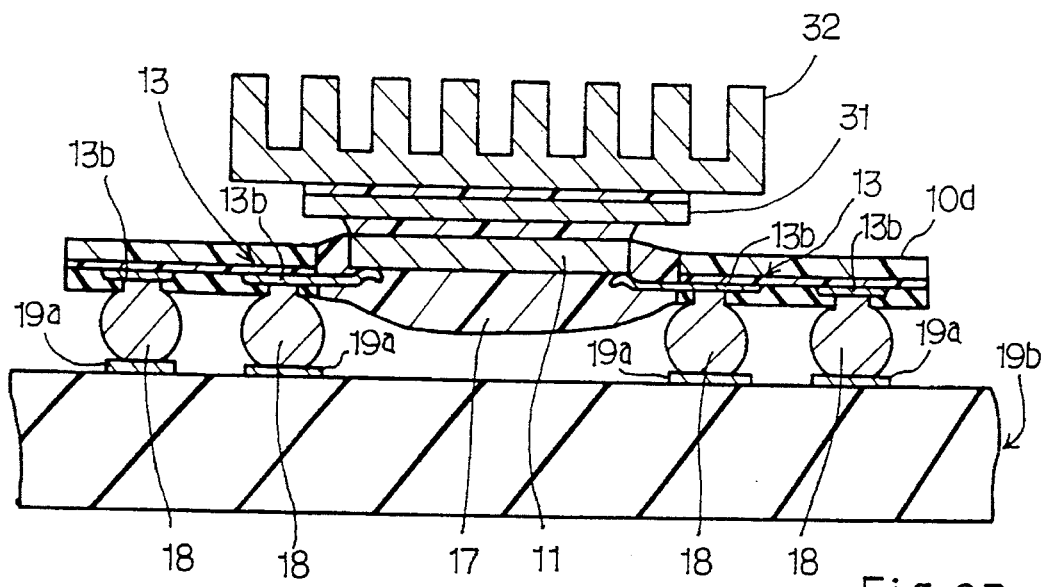
FIG. 6B is a cross sectional view showing another essential step of the modified process according to the present invention.

Finally, the heat radiating plate or both of the heat radiation plate and the heat sink may be bonded to the semiconductor chip before the mounting stage. In detail, FIG. 6A illustrates a heat radiating plate 31 and a heat sink 32 bonded to the semiconductor chip 11 connected to the conductive leads 13. Thereafter, the bumps are formed on the pad portions 13b, and the bumps 18 are bonded to the conductive pattern 19a of the printed circuit board 19b as shown in FIG. 6B.

What is claimed is:

1. A process of mounting a semiconductor chip on a conductive circuit pattern, comprising the steps of:
    a) preparing a tape automated bonding tape having a film carrier tape formed with sprocket holes, a device hole and separation holes around said device hole and a pattern formed from a metal film on one surface of said film carrier tape and containing inner leads and pads coplanar with said inner leads;
    b) connecting said inner leads to electrodes of a semiconductor chip;
    c) covering connections between said inner leads and said electrodes with a piece of resin for protecting said semiconductor chip and making said connection secure;
    d) forming bumps on said pads; cutting along said separation holes for a separation;
    e) aligning said bumps with pads formed on a mounting board; and
    f) connecting said bumps to said pads on said mounting board.

2. A process of mounting a semiconductor chip on a mounting board means, comprising the steps of:
    a) preparing a semiconductor chip, a mounting board means and a tape-automated bonding tape including a film carrier tape having a first area and a second area separable from said first area and a conductive pattern having inner leads and pads electrically connected to said inner leads formed in said second area;
    b) bonding said inner leads to electrodes of said semiconductor chip;
    c) forming conductive bumps on said pads;
    d) separating said second area having said conductive pattern electrically connected to said electrodes of said semiconductor chip from said first area; and
    e) bonding said conductive bumps to a conductive pattern on said mounting board means.

3. The process as set forth in claim 2, further comprising the step of coating said conductive pattern and an exposed sub-area of said second area with a cover-resist layer having holes exposing at least central areas of said pads between said step a) and said step b).

4. The process as set forth in claim 3, in which said cover-resist layer has an initial elastic modulus not greater than a tenth of an elastic modulus of said film carrier tape.

5. The process as set forth in claim 2, further comprising the step of supplying a piece of resin to said semiconductor chip and a part of said film carrier tape for preventing said electrodes and said inner leads from contamination and securely fixing said semiconductor chip to said film carrier tape.

6. The process as set forth in claim 2, in which said conductive bumps bonds said pads to said conductive pattern of said board means through a reflow.

7. The process as set forth in claim 6, in which said reflow is carried out in an inert atmosphere.

8. The process as set forth in claim 2, in which said tape-automated bonding tape further includes a suspended lead extending over a space where said semiconductor chip occupies at said step b),
    said process further comprising the step of coating said conductive pattern and an exposed sub-area of said second area with a cover-resist layer having holes exposing at least central areas of said pads and an area of said suspended lead between said step a) and said step b).
    a heat radiating bump being further formed on the area of said suspended lead.

9. The process as set forth in claim 2, further comprising the step of attaching a heat radiating plate to said semiconductor chip.

10. The process as set forth in claim 9, further comprising the step of attaching a heat sink to said heat radiating plate.

11. The process as set forth in claim 8, further comprising the step of attaching a heat radiating plate to said semiconductor chip after said step e).

12. The process as set forth in claim 11, further comprising the step of attaching a heat sink to said heat radiating plate.

13. The process as set forth in claim 2, in which said inner leads are concurrently bonded to said electrodes.

14. The process as set forth in claim 2, in which said inner leads are sequentially bonded to said electrodes.

* * * * *